(12) United States Patent
Sumida et al.

(10) Patent No.: US 11,569,277 B2
(45) Date of Patent: Jan. 31, 2023

(54) SEMICONDUCTOR DEVICE

(71) Applicant: CANON KABUSHIKI KAISHA, Tokyo (JP)

(72) Inventors: Takayuki Sumida, Kawasaki (JP); Yoshinori Tateishi, Naka-gun (JP); Takahiro Yajima, Odawara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 164 days.

(21) Appl. No.: 17/008,861

(22) Filed: Sep. 1, 2020

(65) Prior Publication Data
US 2021/0074744 A1 Mar. 11, 2021

(30) Foreign Application Priority Data
Sep. 9, 2019 (JP) .............................. JP2019-163704

(51) Int. Cl.
*H01L 27/30* (2006.01)
*H01L 27/146* (2006.01)
*H04N 5/374* (2011.01)
*H01L 31/0236* (2006.01)

(52) U.S. Cl.
CPC .... *H01L 27/1461* (2013.01); *H01L 27/14643* (2013.01); *H01L 27/307* (2013.01); *H01L 31/02366* (2013.01); *H04N 5/374* (2013.01); *H01L 27/14627* (2013.01)

(58) Field of Classification Search
CPC ........... H01L 27/1461; H01L 27/14643; H01L 27/307; H01L 27/14665
See application file for complete search history.

(56) References Cited

U.S. PATENT DOCUMENTS

| 8,203,195 | B2 | 6/2012 | Ivanov et al. | |
| 2009/0057659 | A1* | 3/2009 | Maehara | H01L 51/4213 257/E51.012 |
| 2009/0078877 | A1* | 3/2009 | Yaegashi | G01T 1/2018 250/370.08 |
| 2011/0259409 | A1* | 10/2011 | Naito | H01L 51/4273 136/255 |
| 2015/0188065 | A1* | 7/2015 | Takimoto | H01L 27/1462 257/40 |
| 2016/0211392 | A1* | 7/2016 | So | H01L 31/101 |
| 2017/0272662 | A1* | 9/2017 | Tamaki | H04N 5/3698 |
| 2018/0020171 | A1* | 1/2018 | Miyake | H04N 5/353 |
| 2018/0151625 | A1* | 5/2018 | Hasegawa | H01L 27/286 |
| 2018/0159059 | A1* | 6/2018 | Takemura | H01L 31/10 |
| 2018/0182812 | A1* | 6/2018 | Heo | H01L 27/307 |
| 2018/0294315 | A1* | 10/2018 | Shiomi | H01L 51/441 |

(Continued)

*Primary Examiner* — Jarrett J Stark
(74) *Attorney, Agent, or Firm* — Venable LLP

(57) ABSTRACT

There is disclosed a semiconductor device including: a substrate; a plurality of first electrodes arranged away from each other with gaps on the substrate; a first intermediate layer arranged on each of the plurality of first electrode; a second intermediate layer, at least a part of which is arranged on each of the gaps of the plurality of first electrodes; a photoelectric conversion layer arranged on the first intermediate layer and the second intermediate layer; and a second electrode arranged on the photoelectric conversion layer. A content of oxygen on a molar basis in the second intermediate layer is higher than a content of oxygen on a molar basis in the first intermediate layer.

17 Claims, 12 Drawing Sheets

(56) References Cited

U.S. PATENT DOCUMENTS

| | | | | |
|---|---|---|---|---|
| 2018/0315798 | A1* | 11/2018 | Shimasaki | H01L 27/146 |
| 2018/0342627 | A1* | 11/2018 | Hasegawa | H01L 27/14667 |
| 2019/0006541 | A1* | 1/2019 | So | C30B 29/46 |
| 2019/0081251 | A1* | 3/2019 | Obana | H01L 51/0073 |
| 2019/0214417 | A1* | 7/2019 | Matsuo | H01L 27/307 |
| 2019/0245008 | A1* | 8/2019 | Lee | H01L 27/14667 |
| 2019/0288040 | A1* | 9/2019 | Ujiie | H01L 51/0072 |
| 2019/0312071 | A1* | 10/2019 | Yamasaki | H01L 27/14612 |
| 2019/0371862 | A1* | 12/2019 | Muroyama | H01L 51/0053 |
| 2019/0371863 | A1* | 12/2019 | Hasegawa | H04N 5/361 |
| 2019/0388042 | A1* | 12/2019 | Zhao | H01L 27/14676 |
| 2020/0099003 | A1* | 3/2020 | Ujiie | H01L 51/442 |
| 2020/0295287 | A1* | 9/2020 | Yajima | H01L 51/0007 |
| 2020/0312913 | A1* | 10/2020 | Yajima | H01L 51/442 |
| 2021/0074744 | A1* | 3/2021 | Sumida | H01L 27/14643 |
| 2021/0111291 | A1* | 4/2021 | Fukaya | H01L 31/07 |
| 2021/0242416 | A1* | 8/2021 | Sumida | C09K 11/06 |
| 2021/0313531 | A1* | 10/2021 | Yamaguchi | H01L 51/426 |
| 2021/0391505 | A1* | 12/2021 | Uchida | H01L 33/42 |
| 2022/0028913 | A1* | 1/2022 | Tateishi | G01S 17/931 |
| 2022/0085111 | A1* | 3/2022 | Yajima | H01L 27/30 |

* cited by examiner

SEMICONDUCTOR DEVICE

BACKGROUND OF THE INVENTION

Field of the Invention

The present disclosure relates to a semiconductor device.

Description of the Related Art

In photoelectric conversion units of photodetection devices, photodiodes including impurity diffusion layer formed in a monocrystal silicon substrate are widely used. On the other hand, in recent years, a photodetection device having a photoelectric conversion layer using an organic material or colloidal quantum dots has been proposed. These materials have higher photosensitivity than a silicon in a long-wavelength range. Thus, a photodetection device using a photoelectric conversion layer is featured in a small area and high light use efficiency. U.S. Pat. No. 8,203,195 discloses examples of photodetection devices using a photoelectric conversion layer. One of the photodetection devices disclosed in U.S. Pat. No. 8,203,195 has an adhesion layer between an electrode and a photoelectric conversion layer.

When the structure disclosed in U.S. Pat. No. 8,203,195 is applied to a semiconductor device such as a photodetection device having a plurality of pixels, crosstalk via the adhesion layer may occur between pixels. Accordingly, the present disclosure intends to provide a semiconductor device with reduced crosstalk.

SUMMARY OF THE INVENTION

According to an aspect of the present disclosure, there is provided a semiconductor device including: a substrate; a plurality of first electrodes arranged away from each other with gaps on the substrate; a first intermediate layer arranged on each of the plurality of first electrode; a second intermediate layer, at least a part of which is arranged on each of the gaps of the plurality of first electrodes; a photoelectric conversion layer arranged on the first intermediate layer and the second intermediate layer; and a second electrode arranged on the photoelectric conversion layer. A content of oxygen on a molar basis in the second intermediate layer is higher than a content of oxygen on a molar basis in the first intermediate layer.

Further features of the present invention will become apparent from the following description of exemplary embodiments with reference to the attached drawings.

DESCRIPTION OF THE EMBODIMENTS

Embodiments of the present disclosure will be described below with reference to the drawings. Each of the following embodiments illustrates an exemplary configuration of the present disclosure, and numerical values, shapes, materials, components, arrangement of components, connection relationships between components, or the like are not intended to limit the present disclosure. For example, although, in the following embodiments, a photodetection device is mainly illustrated as an example of a semiconductor device to which the present disclosure may be applied, the present disclosure is applicable to a light-emitting device. Further, the conductivity type of a transistor, a semiconductor region, or the like illustrated in the following embodiments may be changed where necessary.

Further, the same components or corresponding components are labeled with common references throughout a plurality of drawings, and the description thereof may be omitted or simplified. Further, in each drawing, when the same multiple components are arranged, labeling of the reference and the description thereof may be omitted.

First Embodiment

Figure 1:
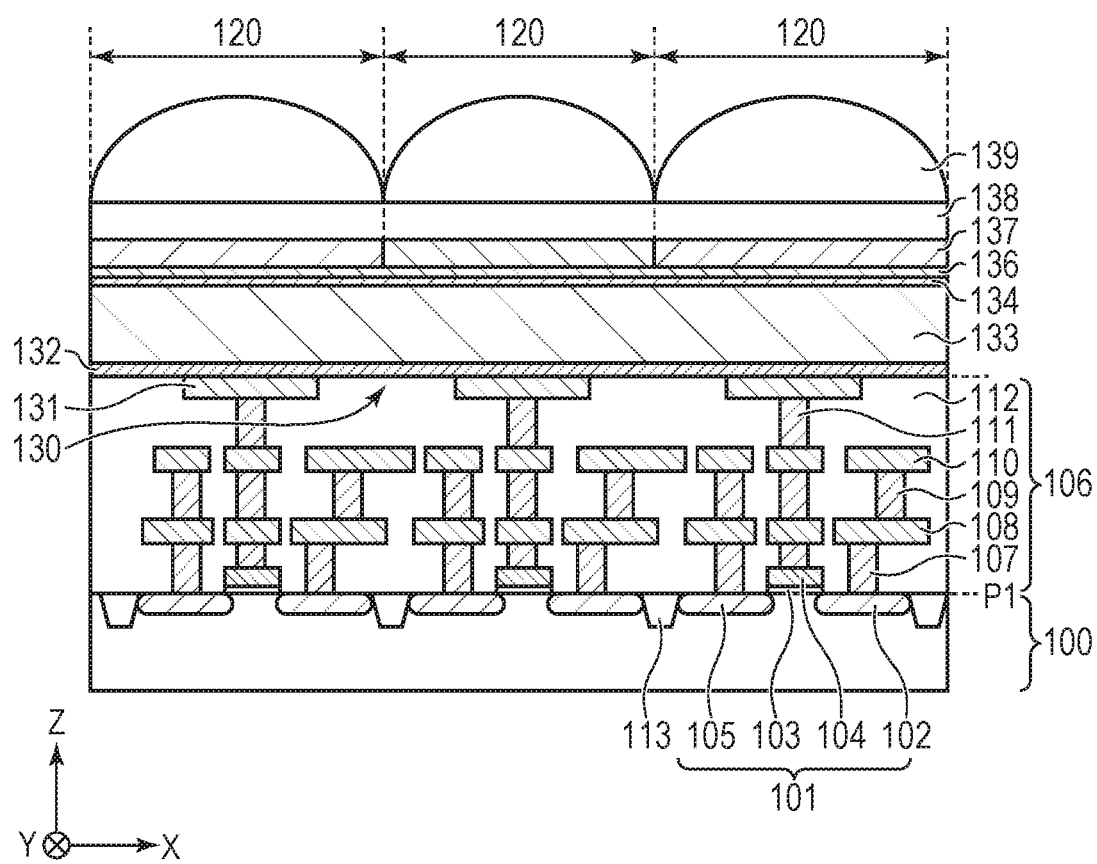
FIG. 1 is a schematic sectional view of a semiconductor device according to a first embodiment.

FIG. 1 is a schematic sectional view of a semiconductor device according to the present embodiment. FIG. 1 illustrates a sectional view of the semiconductor device on a plane including the Z direction (the upward direction in FIG. 1) and the X direction (the rightward direction in FIG. 1). The semiconductor device of the present embodiment is a photodetection device that photoelectrically converts incident light and generates charges in accordance with a light amount of the incident light. FIG. 1 depicts three unit cells 120 of the semiconductor device. Each unit cell 120 is also referred to as a pixel or a subpixel. Each of the three unit cells 120 has the same circuit configuration. The unit cell 120 has at least one photodetection element.

Note that, when the semiconductor device is a light-emitting device, the unit cell 120 has at least one light-emitting element. The semiconductor device functions as a photodetection device or a light-emitting device in accordance with the material of a function layer included in the unit cells 120.

The semiconductor device has a substrate 100. The substrate 100 is a semiconductor substrate of a silicon monocrystal or the like in the present embodiment but may be an insulating substrate of glass, ceramic, or the like. The substrate 100 has a primary face P1. The substrate 100 has transistors 101 and element isolation portions 113 near the primary face P1.

The transistor 101 is an N-type MOS transistor, for example, and includes a source/drain region 102, a gate insulating film 103, a gate electrode 104, and a source/drain region 105. The gate insulating film 103 and the gate electrode 104 are arranged on the primary face P1. The gate insulating film 103 is arranged between the gate electrode 104 and the primary face P1. The source/drain region 102 and the source/drain region 105 are arranged inside the substrate 100. When the transistor 101 is an N-type MOS transistor, the source/drain regions 102 and 105 are N-type semiconductor regions. The element isolation portion 113 has shallow trench isolation (STI) structure, for example.

A wiring structure 106 is arranged on the primary face P1 of the substrate 100. The wiring structure 106 has contact plugs 107, a wiring layer 108, via plugs 109, a wiring layer 110, via plugs 111, and an insulating layer 112. The insulating layer 112 may be a multiplayer film though not illustrated in detail in FIG. 1. These members may be formed by using a material such as a metal, an insulator, or the like generally used in semiconductor process.

The contact plug 107 and the via plugs 109 and 111 may be made of a material selected from aluminum, copper, tungsten, titanium, titanium nitride, or the like, for example. Typically, the contact plug 107 and the via plugs 109 and 111 may have layered structure of titanium, titanium nitride, and tungsten. The wiring layers 108 and 110 may be made of a material selected from aluminum, copper, tungsten, titanium, titanium nitride, tantalum, or the like, for example. Typically, the wiring layers 108 and 110 may have layered structure of tantalum and copper. The insulating layer 112 may be silicon oxide, silicon nitride, or the like, for example.

The wiring structure 106 further has a plurality of lower electrodes 131 (first electrode) arranged apart from each other with gaps. Each of the plurality of lower electrodes 131 is arranged in the corresponding unit cell 120. The gaps between the plurality of lower electrodes 131 form an isolation region 130. The isolation region 130 may be the insulating layer 112 of the wiring structure 106. Each of the plurality of lower electrodes 131 is connected to the corresponding via plug 111. The lower electrode 131 may be made of a material selected from copper, aluminum, or the like.

The semiconductor device has an intermediate layer 132, a function layer 133, and an upper electrode 134 (second electrode). The intermediate layer 132, the function layer 133, and the upper electrode 134 are arranged in this order on the wiring structure 106. The upper electrode 134 is continuously provided across the three unit cells 120. In the present embodiment, the upper face and the lower face of the upper electrode 134 are flat.

The function layer 133 is arranged between the plurality of lower electrodes 131 and the upper electrode 134. The function layer 133 is a photoelectric conversion layer and has a function of photodetection. The lower electrode 131 may be used for readout of a signal based on charges generated by photoelectric conversion.

Note that, when the semiconductor device is a light-emitting device, the function layer 133 has a function of light emission. In such a case, the lower electrode 131 may be used for supplying, to the function layer 133, a control signal used for control of light emission or non-light emission and control of light emission intensity.

The intermediate layer 132 is arranged between each of the plurality of lower electrodes 131 and the function layer 133. The intermediate layer 132 is a layer that ensures electrical insulation for carriers of one of hole or electron between each of the plurality of lower electrodes 131 and the function layer 133 and ensures conduction for the other. Therefore, the intermediate layer 132 can be said to be a carrier injection prevention layer. When the plurality of lower electrodes 131 are electrodes (cathode) that collects holes, the intermediate layer 132 may be a layer that blocks electrons and transfers holes (electron-block layer). Further, when the plurality of lower electrodes 131 are electrodes (anode) that collects electrons, the intermediate layer 132 may be a layer that blocks holes and transfers electrons (hole-block layer). Note that, when the intermediate layer 132 is the electron-block layer, a hole-block layer (not illustrated) may be arranged between the function layer 133 and the upper electrode 134. Further, when the intermediate layer 132 is the hole-block layer, an electron-block layer (not illustrated) may be arranged between the function layer 133 and the upper electrode 134.

Further, the intermediate layer 132 can also function as an adhesion layer between each of the plurality of lower electrodes 131 and the function layer 133. With the intermediate layer 132 being arranged between the lower electrode 131 and the function layer 133, film removal due to poor wettability between the lower electrodes 131 and the function layer 133 can be reduced. It is preferable that the intermediate layer 132 be entirely formed. In such a case, the contact area between the intermediate layer 132 and the function layer 133 can be increased, and the effect of reducing film removal can be further improved.

The semiconductor device has an insulating layer 136, a color filter layer 137, a planarization layer 138, and a micro-lens layer 139. The insulating layer 136, the color filter layer 137, the planarization layer 138, and the micro-lens layer 139 are arranged in this order on the upper electrode 134. The insulating layer 136 may function as a protection layer and a sealing layer. The color filter layer 137 has a color filter of any one of a plurality of colors. Each of the plurality of unit cells 120 includes a color filter of a corresponding color. The planarization layer 138 has a flat upper face suitable for formation of the micro-lens layer 139. The micro-lens layer 139 has a plurality of micro lenses. One unit cell 120 includes one micro-lens.

Figure 2:
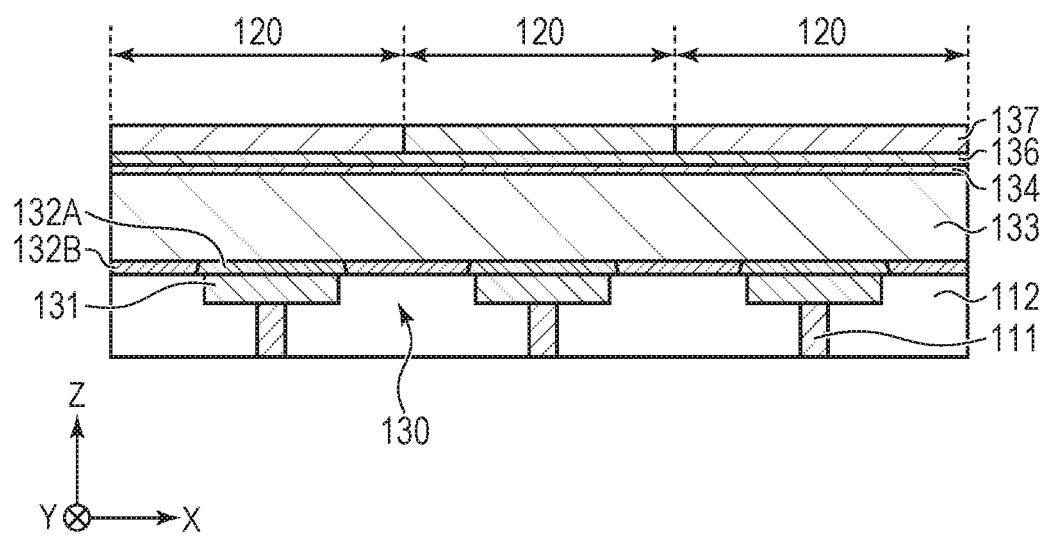
FIG. 2 is a schematic enlarged sectional view of a part around an intermediate layer of the semiconductor device according to the first embodiment.
Figure 3:
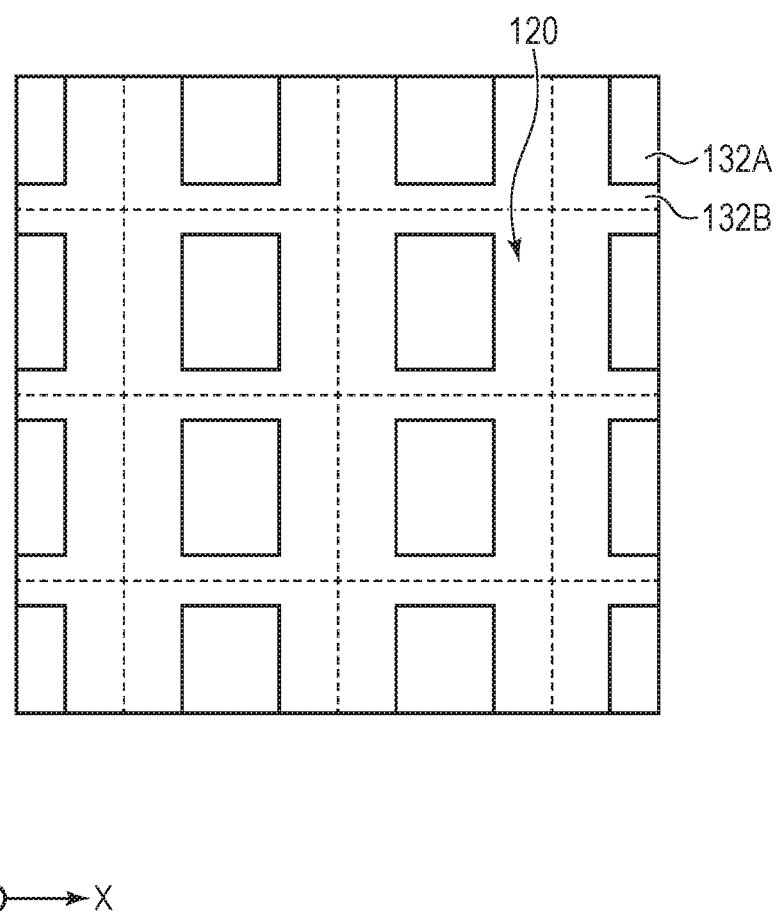
FIG. 3 is a schematic plan view illustrating the arrangement of the intermediate layer of the semiconductor device according to the first embodiment.

FIG. 2 is a schematic enlarged sectional view of a part around the intermediate layer 132 of the semiconductor device according to the first embodiment. FIG. 3 is a schematic plan view illustrating the arrangement of the intermediate layer 132 of the semiconductor device according to the present embodiment. As illustrated in FIG. 2 and FIG. 3, the intermediate layer 132 has first portions 132A (first intermediate layer) and second portions 132B (second intermediate layer). Each first portion 132A is a portion of the intermediate layer 132 arranged on the lower electrode 131. Each second portion 132B is a portion of the intermediate layer 132 arranged on the isolation region 130 that is the gap between two lower electrodes 131. In the photodetection device, since the unit cells 120 are arranged in a matrix forming a plurality of rows and a plurality of columns, the plurality of first portions 132A are also arranged in a matrix in the same manner as the unit cells 120. Further, the second portions 132B are arranged in regions between the plurality of first portions 132A.

Herein, the content of oxygen on a molar basis in the second portion 132B is higher than the content of oxygen on a molar basis in the first portion 132A. Note that, in the following description, the content of oxygen on a molar basis may be referred to as an oxidation degree. For example, when the material of the intermediate layer 132 is titanium oxide (TiOx), since the valence of titanium is higher and the oxidation degree is larger for a larger value of x, the value of x may be an index of the oxidation degree. Note that the oxidation degree can be measured by observing constituent elements or an electronic state of the intermediate layer 132 by X-ray photoelectron spectroscopy (XPS) or the like.

The intermediate layer 132 is formed continuously over the lower electrodes 131 and over the isolation region 130. Thus, the contact area between the intermediate layer 132 and the function layer 133 can be increased as described above, and the effect of reducing film removal can be improved. Herein, since the second portion 132B of the intermediate layer 132 is arranged on the isolation region 130, crosstalk may occur between the lower electrodes 131 via the second portion 132B. Crosstalk is reduced when the electrical conductivity of the second portion 132B of the intermediate layer 132 is lower. However, when the electrical conductivity of the first portion 132A of the intermediate layer 132 is low, transfer of carriers between the lower electrode 131 and the function layer 133 may be prevented. When transfer of carriers between the lower electrode 131 and the function layer 133 are prevented, this reduces accuracy in reading out charges generated in the function layer 133. In such a way, since the characteristic required for the first portion 132A and the characteristic required for the second portion 132B are different from each other, it may be difficult to achieve both reduction of crosstalk and ensured transfer of carriers between the lower electrode 131 and the function layer 133.

Accordingly, in the present embodiment, the intermediate layer 132 is formed such that the oxidation degree of the second portion 132B is higher than the oxidation degree of the first portion 132A. In general, the electrical conductivity of the intermediate layer 132 is lower for a higher oxidation degree. Thus, by forming the intermediate layer 132 as described above, it is possible to reduce the electrical conductivity of the second portion 132B to be lower than the electrical conductivity of the first portion 132A. According to such a configuration, crosstalk can be reduced because of the low electrical conductivity of the second portion 132B, and a state where carriers can freely move between the lower electrode 131 and the function layer 133 can be maintained because of the high electrical conductivity of the first portion 132A.

Note that a configuration in which the second portions 132B of the intermediate layer 132 are removed may be conceivable, however, film removal between the intermediate layer 132 and the function layer 133 may occur because the contact area between the intermediate layer 132 and the function layer 133 is smaller in such a configuration. If a material that enhances adhesion between the function layer 133 and the lower electrodes 131 is used for the function layer 133, film removal may be reduced. In such a case, however, the type of materials that can be used for the function layer 133 is limited, and the photosensitivity characteristic of the function layer 133 may be reduced. Therefore, since both quality and performance required for a photodetection device may not be achieved at the same time in the configuration in which the second portions 132B are removed, the configuration of the present embodiment is more preferable than the configuration in which the second portions 132B are removed.

Further, in the present embodiment, as illustrated in FIG. 2, the right end of the first portion 132A is located on the right side of the right end of the lower electrode 131, and the left end of the first portion 132A is located on the left side of the left end of the lower electrode 131. In other words, the intermediate layer 132 is formed such that the outer edge of the first portion 132A is located outer than the outer edge of the lower electrode 131 in plan view. This reduces influence of manufacture variation on the positions of the lower electrode 131 and the first portion 132A. The clearance between the outer edge of the lower electrode 131 and the outer edge of the first portion 132A may be greater than or equal to 0.01 μm and less than or equal to 5.0 μm in taking the size of the unit cell 120 into consideration. To more effectively reduce crosstalk, it is preferable to reduce the clearance to widen the region of the second portion 132B having a high oxidation degree and a low electrical conductivity. Therefore, also in taking a reduction of crosstalk into consideration, it is preferable that the clearance be greater than or equal to 0.01 μm and less than or equal to 0.1 μm.

When the oxidation number is focused on, the photoelectric conversion device according to one embodiment of the present disclosure may be described as follows. The photoelectric conversion device has a first lower electrode, a second lower electrode, a second electrode, and a photoelectric conversion layer arranged between the first lower electrode and the second electrode and has an insulating layer between the first lower electrode and the second lower electrode in plan view. The photoelectric conversion device has a first metal and a second metal whose oxidation number is higher than the first metal in a region between the photoelectric conversion layer and a set of the first lower electrode, the second lower electrode, and the insulating layer. A molar ratio of the first metal to the sum of the first metal and the second metal in a region overlapping the first lower electrode in plan view is defined as a first molar ratio. A molar ratio of the first metal to the sum of the first metal and the second metal in a region overlapping the insulating layer between the first lower electrode and the second lower electrode in plan view is defined as a second molar ratio. Herein, the first molar ratio is larger than the second molar ratio.

The first metal and the second metal may be the same type of metal. For example, the first metal may be titanium contained in titanium monoxide, and the second metal may be titanium contained in titanium dioxide.

Next, the material or the like of the function layer 133 that may be applied to the semiconductor device of the present embodiment will be described. As described above, the function layer 133 may function as a photoelectric conversion layer, and the material and the manufacturing method thereof are not particularly limited. The function layer 133 may be made of an inorganic material or may be made of an organic material. For the function layer 133, quantum dots each of which is a collection of nanoparticles of an amorphous silicon, an organic semiconductor, a compound semiconductor, or the like may be used, for example. The organic semiconductor that may be used for nanoparticles may be, for example, fullerene (C60), coumarin 6 (C6), rhodamine 6G (R6G), quinacridone, a phthalocyanine based compound, a naphthalocyanine based compound, or the like.

A configuration example when the function layer 133 is made of colloidal quantum dots containing semiconductor nanoparticles will be described. The colloidal quantum dot contains nanoparticles whose mean particle diameter is greater than or equal to 0.5 nm and less than 100 nm. For the material of the nanoparticles, a single-element semiconductor (group IV semiconductor) or a compound semiconductor may be used. The compound semiconductor may be a group III-V semiconductor, may be a group II-VI semiconductor, or may be a semiconductor consisting of a combination of three or more elements of group II, group III, group IV, group V, and group VI. Specifically, a semiconductor such as PbS, PbSe, PbTe, InN, InAs, InP, InSb, InAs, InGaAs, CdS, CdSe, CdTe, Ge, CuInS, CuInSe, CuInGaSe, Si, or the like may be employed. These materials are semiconductor material having a relatively narrow bandgap. The colloidal quantum dot may contain only one type of nanoparticles or may contain two or more types of nanoparticles of the materials described above. The colloidal quantum dot containing these materials may be referred to as a semiconductor quantum dot. The structure of the nanoparticle may be the core shell structure including a core containing the semiconductor described above and a cover material covering the core.

The size of the nanoparticle may be set to be less than or equal to a size similar to an exciton Bohr radius unique to each semiconductor material. In such a case, with expression of a quantum size effect, a desired bandgap in accordance with the size is obtained. That is, the nanoparticle is controlled to have a size of a predetermined value and manufactured, and thereby the light absorption wavelength or the light emission wavelength is controlled.

It is preferable that the material used for the nanoparticle be PbS or PbSe in terms of easiness of synthesis. Since the exciton Bohr radius of PbS is around 18 nm, it is preferable that the mean particle diameter of nanoparticles be in a range of 2 nm to 15 nm in terms of control of crystal growth and expression of the quantum size effect. With the mean particle diameter of the nanoparticle being greater than or equal to 2 nm, crystal growth is more easily controlled in synthesis of nanoparticles. Note that a transmission electron microscope may be used for measurement of the particle diameter of the nanoparticle.

The film thickness of the function layer 133 is not particularly limited and preferably greater than or equal to 10 nm, more preferably greater than or equal to 50 nm in terms of obtaining a high light absorbance characteristic. Further, the film thickness of the function layer 133 is preferably less than or equal to 800 nm in terms of easiness of manufacturing.

Next, the material or the like of the intermediate layer 132 that may be applied to the semiconductor device of the present embodiment will be described. The intermediate layer 132 may be an electron-block layer or a hole-block layer in accordance with the type of carriers collected by the lower electrode 131, as described above. Further, the intermediate layer 132 has a function as an adhesion layer used for suppressing film removal of the function layer 133.

First, a case where the intermediate layer 132 is the electronic block layer will be described. It is preferable that the material of the electronic block layer be a material that can efficiently transport holes generated in the function layer 133, which is a photoelectric conversion layer, to the positive electrode. It is preferable that the material have a nature such as a high hole mobility, a high electrical conductivity, a small hole injection barrier with respect to a positive electrode, a small hole injection barrier from the photoelectric conversion layer to the electron-block layer, or the like. Furthermore, if light is taken into the photoelectric conversion layer via the electron-block layer, it is preferable that a material having high transparency be used for the material of the electron-block layer. The transmittance of visible light in a transparent electron-block layer is preferably greater than or equal to 60%, more preferably greater than or equal to 80%. From such a point of view, a specific example of material of the electron-block layer may be a P-type inorganic semiconductor such as molybdenum oxide ($MoO_3$) or nickel oxide (NiO) or a P-type organic semiconductor such as PEDOT:PSS.

Next, a case where the intermediate layer 132 is the hole-block layer will be described. The function required for a hole-block layer is to block holes generated by the photoelectric conversion layer and transport electrons to the negative electrode in contrast to the electron-block layer. Therefore, in the description for the electron-block layer described above, a nature obtained by replacing the positive electrode with the negative electrode and replacing the P-type semiconductor with the N-type semiconductor is a preferable nature in the hole-block layer. If light is emitted from the negative electrode side or if light reflected at the negative electrode side is utilized, it is preferable a material having a high transparency be used for the material of the hole-block layer. From such a point of view, the specific example of the material of a hole-block layer may be an N-type wide gap semiconductor such as titanium oxide ($TiO_2$) or zinc oxide (ZnO) or an N-type semiconductor such as fullerene (C60). In particular, the oxide based inorganic semiconductor is more preferable, because it is possible to easily change the electrical conductivity by controlling the oxidation degree by a deposition condition or a process after deposition.

The film thickness of the intermediate layer 132 is not particularly limited and may be, for example, around 1 nm to 100 nm. When the film thickness of the intermediate layer 132 is small, the voltage applied to the function layer 133 can be reduced. In contrast, when the film thickness of the intermediate layer 132 is large, the probability of electrons or holes passing through the intermediate layer 132 due to a tunnel effect can be reduced. Further, when the film thickness of the intermediate layer 132 is large, occurrence of a film defect due to a pinhole or the like can be reduced. For example, when the film thickness of the intermediate layer 132 is thicker than the roughness of the surface of the lower electrode 131, a defect in the first portion 132A of the intermediate layer 132 may be reduced. The film thickness of the intermediate layer 132 may be set as appropriate in taking these points of view into consideration.

The intermediate layer 132 is a layer that can control injection of charges by applying an electric field in the film thickness direction. However, charges may freely move also in the horizontal direction to the film thickness inside the intermediate layer 132. Thus, when the electrical conductivity of the intermediate layer 132 is high as described above, transfer of charges in the horizontal direction described above may cause crosstalk.

Next, the material or the like of the lower electrode 131 and the upper electrode 134 that may be applied to the semiconductor device of the present embodiment will be described. The lower electrode 131 and the upper electrode 134 can be formed of any conductive material. A specific example of the material of the lower electrode 131 and the upper electrode 134 may be a metal such as platinum, gold, silver, aluminum, chrome, nickel, copper, titanium, magnesium, or the like and an alloy containing these metals. Alternatively, the material of the lower electrode 131 and the upper electrode 134 may be metal oxide such as indium oxide, tin oxide, or the like or may be composite oxide including these materials (for example, ITO or IZO). Further, the material of the lower electrode 131 and the upper electrode 134 may be a material using conductive particles such as carbon black, fullerene, carbon nanotube, graphene, or the like or may be a composite material in which these materials are dispersed in a matrix such as a polymer binder. The material of the lower electrode 131 and the upper electrode 134 may be a material using one type of the examples described above alone or may be a material using two or more types thereof in a predetermined combination and ratio.

Herein, it is preferable that at least one of the lower electrode 131 and the upper electrode 134 be transparent. In such a case, the transparent electrode can transmit light absorbed by the function layer 133. When the semiconductor device is a light-emitting device, the transparent electrode can transmit light emitted from the function layer 133.

The lower electrode 131 and the upper electrode 134 have a function of collecting electrons or holes occurring inside the function layer 133. It is therefore more preferable to use a material suitable for collecting electrons or holes for the material of the lower electrode 131 and the upper electrode 134. An example of the material of the electrode suitable for collecting holes may be a material having a high work function, such as gold, ITO, or the like. An example of the material suitable for collecting electrons may be a material having a low work function, such as aluminum.

The film thickness of the lower electrode 131 and the upper electrode 134 is not particularly limited and may be determined as appropriate in taking required electrical conductivity, transparency, or the like into consideration. Typically, the film thickness thereof is around 10 nm to 10 µm.

Figure 4A:
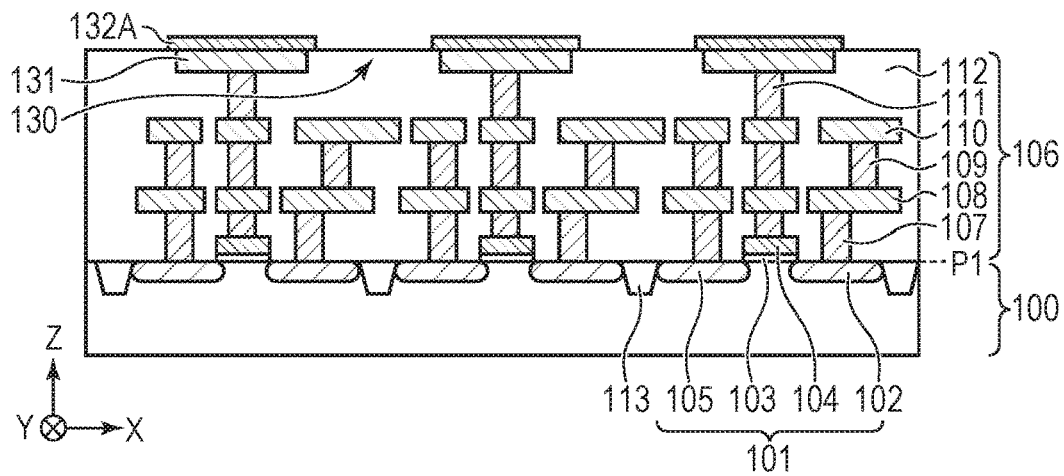
FIG. 4A, FIG. 4B and FIG. 4C are schematic sectional views illustrating a manufacturing method of the semiconductor device according to the first embodiment.
Figure 4B:
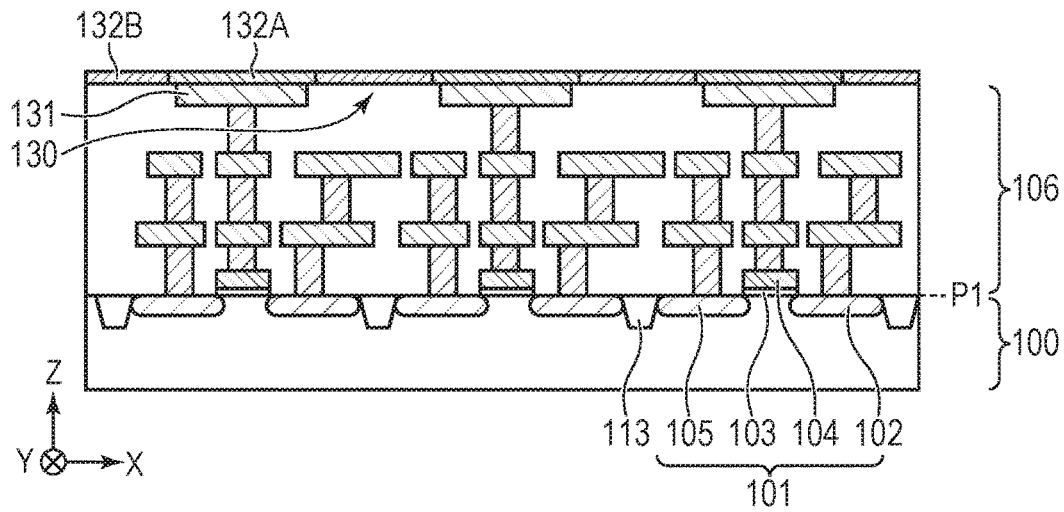
Figure 4C:
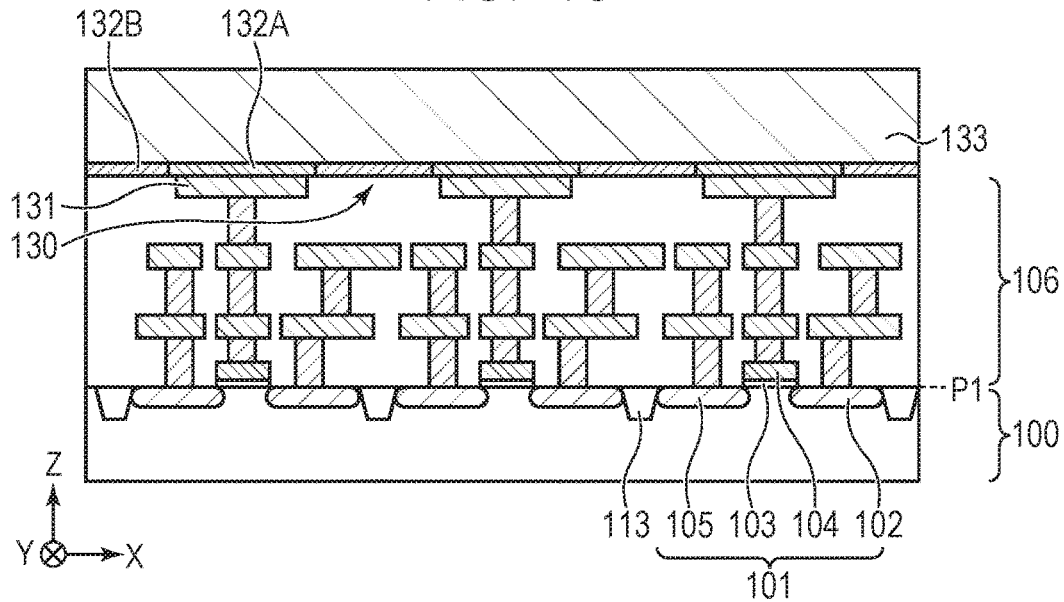

FIG. 4A to FIG. 4C are schematic sectional views illustrating a manufacturing method of the semiconductor device according to the present embodiment. The manufacturing method of the semiconductor device will be described with reference to FIG. 4A to FIG. 4C.

First, a step of forming the wiring structure 106 and the first portions 132A of the intermediate layer 132 will be described with reference to FIG. 4A. First, the substrate 100 is prepared. Next, the element isolation portions 113 and the transistors 101 are formed in the substrate 100. Next, the wiring structure 106 is formed on the substrate 100. Next, the lower electrodes 131 are formed on the via plugs 111. A step of forming the insulating layer 112 may be performed again after the lower electrodes 131 are formed. At this time, a planarization process is performed so that the height of the upper face of the insulating layer 112 and the height of the upper face of the lower electrodes 131 become the same. The planarization process may be performed by etching or chemical mechanical polishing (CMP) method. A general semiconductor process may be applied to manufacturing of each layer described above. The intermediate layer 132 is then deposited on the insulating layer 112 and the lower electrodes 131 by using a deposition method, a sputtering method, or the like, the intermediate layer 132 is patterned, and thereby the first portions 132A of the intermediate layer 132 are formed. In such a way, the structure of FIG. 4A is completed.

The deposition conditions for forming the first portions 132A of the intermediate layer 132 will be described with an example of a case where the material of the intermediate layer 132 is titanium oxide. The titanium oxide may be deposited by sputtering apparatus using a $TiO_2$ target. The deposition condition at this time is that RF power is 500 W, a flowrate of an introduced argon gas is 100 sccm, and a pressure inside the chamber is 0.5 Pa, for example. In this condition, no oxygen is mixed in a gas introduced during deposition. Since this causes many oxygen defects to occur in the deposited oxide titanium film, the oxidation degree of the first portion 132A decreases, and the valence of titanium also decreases.

Next, a step of forming the second portions 132B of the intermediate layer 132 will be described with reference to FIG. 4B. After the completion of the structure of FIG. 4A, the intermediate layer 132 is deposited and patterned by a liftoff process, for example, and thereby the second portions 132B of the intermediate layer 132 are formed. Herein, a deposition method, a sputtering method, or the like may be used for the step of deposition. In such a way, the structure of FIG. 4B is completed.

The deposition condition for forming the second portions 132B of the intermediate layer 132 will be described with an example of the case where the material of the intermediate layer 132 is titanium oxide. The deposition condition at this time may be a condition obtained by changing the condition of an introduction gas so as to mix an oxygen gas of a flowrate of 5 sccm in addition to the argon gases of a flowrate of 100 sccm in the condition for forming the first portions 132A described above. Since mixing of the oxygen gas to the introduction gas reduces oxygen defects in the deposited titanium oxide film, the oxidation degree of the second portion 132B increases, and the valence of titanium also increases.

Note that, although FIG. 4A and FIG. 4B illustrate the example in which the first portions 132A and the second portions 132B of the intermediate layer 132 are separately deposited, a part of the intermediate layer 132 may be oxidized to form the first portions 132A and the second portions 132B. First, after titanium oxide with a low oxidation degree is deposited entirely, a resist mask is then formed by photolithography on a region where the first portions 132A are to be formed. An oxidization process is then performed by using this resist mask as a protection layer, and thereby only the region of the second portions 132B that are not protected by the resist mask can be oxidized. The same structure as that of FIG. 4B may be formed also by such a method. Note that plasma oxidation, UV ozone oxidization, or the like may be used for the oxidization process.

Next, a step of forming the function layer 133 will be described with reference to FIG. 4C. After the completion of the structure of FIG. 4B, quantum dots or the like are formed, and thereby the function layer 133 is formed. An example of fabrication of quantum dots of lead sulfide (PbS) will be described below as an example of a method of forming the function layer 133. Note that the specific fabrication conditions as illustrated below are examples and not particularly limited.

First, an example of a synthesis step of the quantum dots of lead sulfide (PbS) will be described. First, lead oxide (PbO) 892 mg, octadecene 40 mL, and oleic acid 4 mL are supplied into a three-neck flask, and the three-neck flask is set in an oil bath. The set temperature of the oil bath is 90 degrees Celsius. At this time, to prevent oxidization of the quantum dot during reaction, nitrogen flow is performed at a flowrate of 0.5 L/min to form nitrogen atmosphere in the three-neck flask. The solution is stirred over 30 minutes until a light yellow solution when supplied to the oil bath changes to be transparent.

In parallel to the above, 20 mL of an octadecene solution of 1.9 mM bistrimethylsilyl sulfide is prepared in advance in a syringe within a glove box under a nitrogen atmosphere. This solution is a sulfur source. A solution of this sulfur source is rapidly added to the transparent solution in the three-neck flask. The three-neck flask is taken out from the oil bath after one minute from the addition and naturally cooled for two hours. After the solution reaches the room temperature, the step moves on to the next purification process. Note that the solution obtained after the process of the synthesis step is black, and generation of quantum dots of lead sulfide (PbS) having the surface protected by oleic acid can be observed.

Next, a purification step will be described. The octadecene dispersion liquid of the quantum dots obtained by the synthesis step is transferred from the three-neck flask to a centrifuge tube. If acetone that is polar solvent is added to the solution, the quantum dots are in a state where stable dispersion in the octadecene solution is difficult. The centrifuge tube added with acetone is set in a centrifugal separator to perform centrifugal separation, and thereby the quantum dots are precipitated. Note that the condition of centrifugal separation at this time is 17000 rpm for 20 minutes.

The centrifuge tube is then taken out from the centrifugal separator, clear acetone supernatant is discarded, toluene that is a nonpolar solvent is added to the quantum dots precipitated on the bottom of the centrifuge tube. After addition of toluene, the centrifuge tube is shaken to cause the quantum dots to re-disperse into toluene. Acetone is again added to this toluene dispersion liquid and set in the centrifugal separator, centrifugal separation is performed in the condition of 15000 rpm for 5 minutes, and thereby the quantum dots are again precipitated.

With three-time repetition of such precipitation with acetone and re-dispersion with toluene, the quantum dot dispersion liquid can be purified, and toluene dispersion liquid of the quantum dots can be obtained. Note that the polar solvent used for precipitation of the quantum dots may be methanol, ethanol, or the like other than acetone, however, such a polar solvent that less affects oleic acid protecting the quantum dot, that is, causes little detachment of oleic acid from the quantum dot surface is preferable.

Next, a fabrication step of a quantum dot application liquid used in application for forming a quantum dot film on the substrate will be described. Acetone is added to the toluene dispersion liquid of the quantum dots obtained by the purification step described above, centrifugal separation is performed to cause the quantum dots to be precipitated. Then, finally, the quantum dots are re-dispersed not in toluene but in octane to fabricate a liquid having a concentration of 80 mg/mL, which is used as a quantum dot application liquid in a step described later.

Next, a formation step of a quantum dot film will be described. First, the quantum dot application liquid described above is dropped onto the center of the substrate set in a spin coating apparatus to perform spin coating. At this time, the spin coat condition is 2500 rpm for 30 seconds. Since the spin-coated quantum dot film is a collection of quantum dots protected by oleic acid having a long molar length, the spacing between particles is large. Thus, such quantum dots have poor conductivity of photocarriers generated when irradiated with light and less functions for photoelectric conversion. Herein, such a film is referred to as an oleic acid-protected quantum dot film.

Thus, a process of replacing a ligand is performed by replacing oleic acid that is coordinate-bonded to an atom near the surface of the nanoparticle contained in the oleic acid-protected quantum dot film with a substance having a shorter molar length. In the following, such a process is referred to as ligand replacement, and the substance used in ligand replacement may be simply referred to as a ligand. Further, a solution containing the substance used in ligand replacement may be referred to as a ligand solution. Herein, 1,4-benzenedithiol is used as an organic ligand. Further, an example using 4-methylbenzoic acid will also be described as a comparative example thereto. While 1,4-benzenedithiol has only the thiol group as a functional group, 4-methylbenzoic acid has the methyl group and the carboxyl group. Since the carboxyl group of 4-methylbenzoic acid forms chemical bonding to titanium oxide, adhesiveness to titanium oxide is improved. As a ligand solution for ligand replacement, an acetonitrile solution of 3 mM 1,4-benzenedithiol is used. Note that a methanol solution of 10 mM 4-methylbenzoic acid is used in the comparative example. Further, after ligand replacement using these organic ligands, halogen (iodine, chlorine and bromine) may be added thereto as an inorganic ligand. For example, an N,N-dimethylformamide solution of 10 mM lead iodide may be used.

The ligand replacement step is performed by applying the ligand solution described above onto the oleic acid-protected quantum dot film formed on the substrate. Specifically, a ligand solution is applied onto the overall oleic acid-protected quantum dot film, and ligand replacement reaction is performed for a predetermined period. The reaction period is 30 seconds in the ligand replacement reaction for both 1,4-benzenedithiol and 4-methylbenzoic acid. However, this reaction period may be changed as appropriate in taking the concentration of the ligand solution or the like into consideration. After a predetermined reaction period has elapsed, the substrate is rotated at 200 rpm for 60 seconds, thereby ligand solution is removed from the substrate, and the substrate is dried. Then, to remove excessive ligands remaining in the quantum dots, the substrate is rinsed by using acetonitrile or methanol that is a solvent used for dissolution of ligands. Then, the substrate is rinsed by using octane, and thereby oleic acid separated from the quantum dots is removed.

With the above step, oleic acid bonded to atoms near the surfaces of nanoparticles of the oleic acid-protected quantum dot film is separated and replaced with predetermined ligands, and a 1,4-benzenedithiol quantum dot film or a 4-methylbenzoic acid quantum dot film is formed. Note that the film thickness of the 1,4-benzenedithiol quantum dot film and the 4-methylbenzoic acid quantum dot film obtained after the ligand replacement is 40 nm to 60 nm. Further, the same ligand replacement procedure as described above may be performed after the ligand replacement with these organic ligands, and halogen may be added thereto as an inorganic ligand. A specific example of halogen addition may be iodine addition using a lead iodine solution. The reaction period in such iodine addition is 3 minutes.

Note that the organic ligand that may be used in the present embodiment is not limited to 1,4-benzenedithiol. For example, a ligand such as an organic compound including ethanedithiol, 1,3-benzenedithiol, benzenediamine, or dibenzenediamine may be used. In particular, the boiling point of a ligand including a benzene ring, such as 1,4-benzenedithiol, 1,3-benzenedithiol, or the like, exceeds 200 degrees Celsius. Thus, since separation and decomposition of ligands and volatilization of ligands from the quantum dot surfaces are reduced even under a high temperature of 140 degrees Celsius or higher, an advantageous effect of improvement in heat resistance of the quantum dots is obtained. Further, although, other than 4-methylbenzoic acid, a ligand such as 3-mercaptopropionic acid having a thiol group and a carboxyl group may be selected in terms of adhesiveness, there is a problem of heat resistance compared to a ligand having a benzene ring.

The oleic acid-protected quantum dot film is again formed on the quantum dot film obtained after the ligand replacement, ligand replacement is performed, and a step of rinsing is repeated to form a quantum dot film for multiple times. In such a way, the 1,4-benzenedithiol quantum dot film or the 4-methylbenzoic acid quantum dot film having a predetermined film thickness can be formed. Note that, in the present embodiment, formation of the quantum dot film is repeated for seven times to form seven layers of quantum dot films (film thickness of 420 nm).

The upper electrode 134 is then formed. As described above, the electron-block layer may be formed between the function layer 133 and the upper electrode 134, and when the electron-block layer is made of molybdenum oxide, this step may be vacuum deposition. Then, the insulating layer 136, the color filter layer 137, the planarization layer 138, and the micro-lens layer 139 are sequentially formed. Since a general manufacturing method for a semiconductor device can be applied to each manufacturing of the above, the detailed description of the manufacturing method will be omitted. As described above, the semiconductor device illustrated in FIG. 2 can be manufactured.

Figure 5:
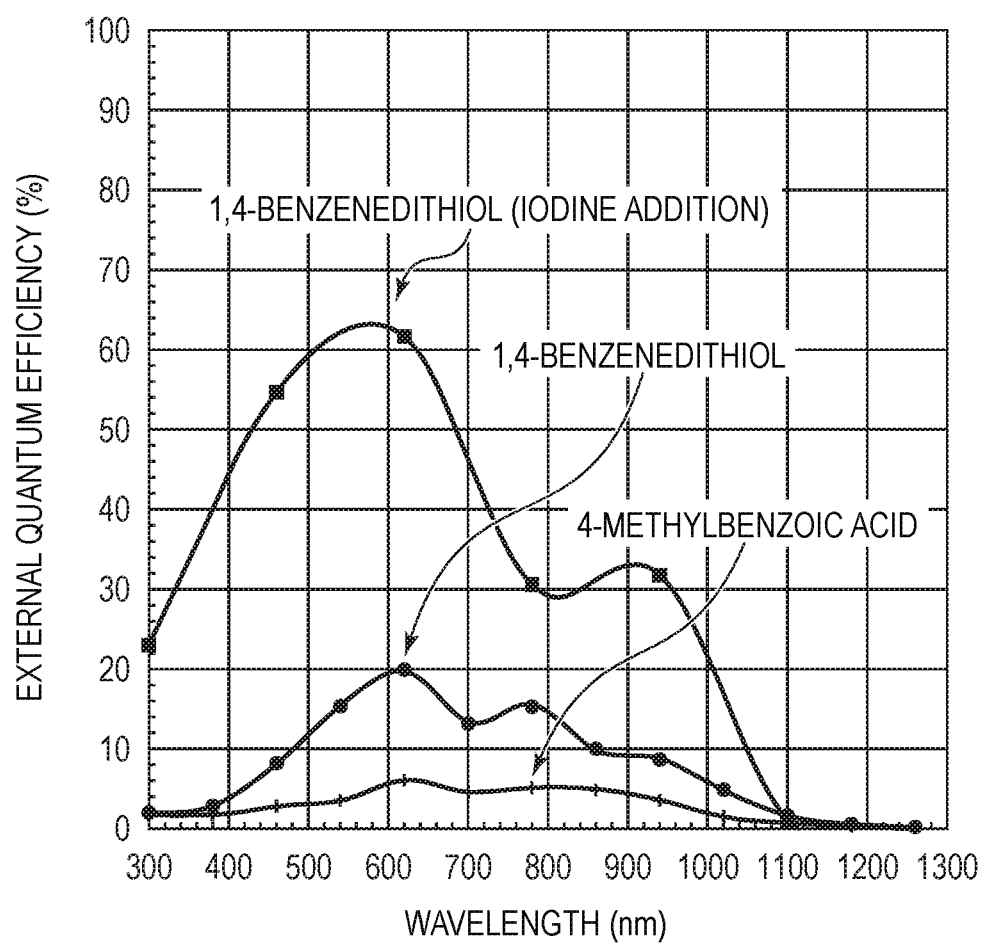
FIG. 5 is a graph illustrating an external quantum efficiency of a quantum dot film according to the first embodiment.

FIG. 5 is a graph illustrating wavelength dependency of external quantum efficiency of the quantum dot film according to the present embodiment. FIG. 5 illustrates comparison of 1,4-benzenedithiol according to the present embodiment and 4-methylbenzoic acid according to the comparative example. For 1,4-benzenedithiol, two types of one with iodine addition and the other without iodine addition are illustrated.

As illustrated in FIG. 5, the quantum dot film using 1,4-benzenedithiol has a higher external quantum efficiency than the quantum dot film using 4-methylbenzoic acid. Because of having a carboxyl group that strongly bonds to titanium oxide, 4-methylbenzoic acid is advantageous in terms of the adhesiveness. In terms of the photoelectric conversion performance, however, 1,4-benzenedithiol is more effective than 4-methylbenzoic acid.

Further, as illustrated in FIG. 5, 1,4-benzenedithiol with iodine addition has higher external quantum efficiency than 1,4-benzenedithiol without iodine addition. It is considered that this is because of passivation of iodine against a surface defect existing on the surface of the quantum dot. Note that whether or not the added iodine is present can be observed by TOF-SIMS analysis or XPS analysis. Although 1,4-benzenedithiol has no carboxyl group, film removal would not occur even when no adhesive layer is further provided on the intermediate layer 132 of titanium oxide. This is because the intermediate layer 132 of titanium oxide is deposited entirely and the contact area between the function layer 133 of 1,4-benzenedithiol and the intermediate layer 132 of the titanium oxide film is sufficiently large.

Figure 6:
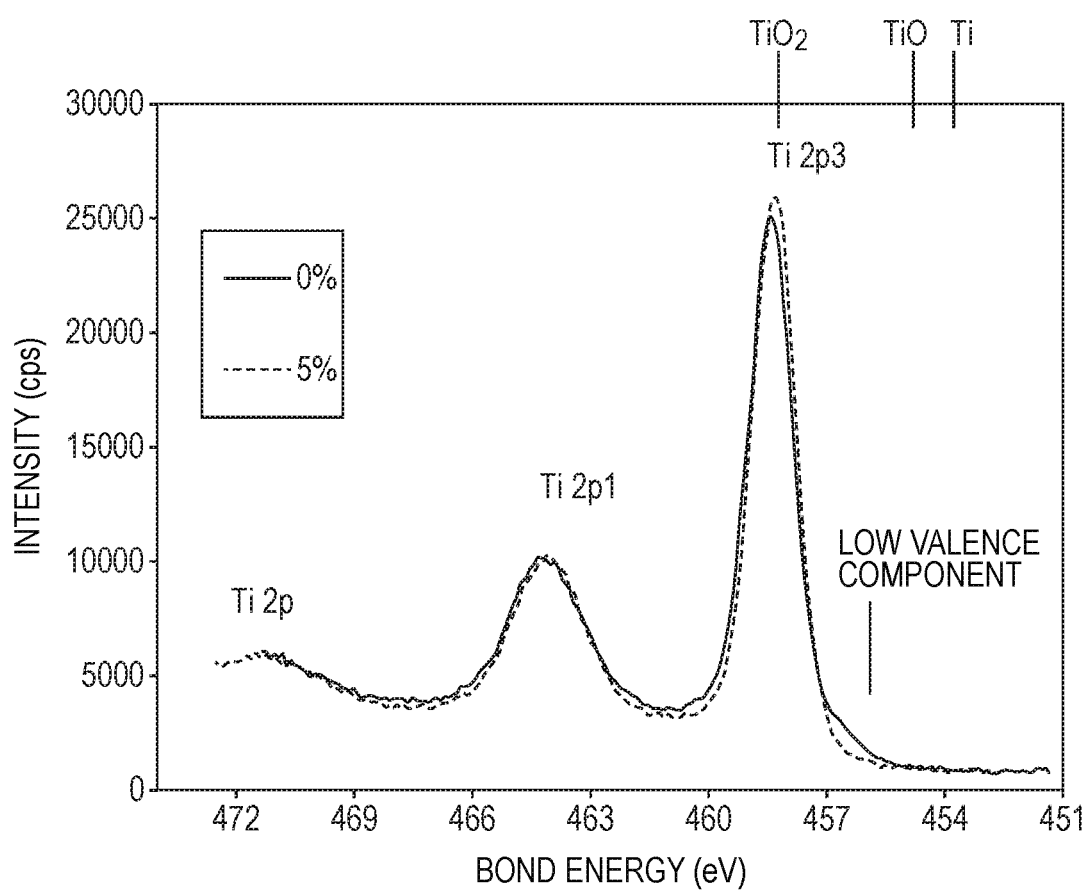
FIG. 6 is a graph illustrating a measurement result by X-ray photoelectron spectroscopy (XPS) of a titanium oxide film according to the first embodiment.

FIG. 6 is a graph illustrating a measurement result by XPS of the titanium oxide film according to the present embodiment. FIG. 6 illustrates comparison of a case where oxygen is not mixed in the introduction gas during deposition (oxygen mixture ratio is 0%) and a case where oxygen is mixed (oxygen mixture ratio is 5%). As can be seen from FIG. 6, the peak present across a range of bond energy near 456 eV to 459 eV indicates titanium oxide.

In the titanium oxide film deposited with the oxygen mixture ratio of 0%, a low valence component of titanium oxide, that is, a small peak derived from a component whose oxidation degree is low is observed around 456 eV on the bottom of the spectrum. The area ratio of the small peak to the main peak around 458 eV is 6%. On the other hand, in the titanium oxide film deposited with the oxygen mixture ratio of 5%, no small peak is observed. It is found from this observation that the titanium oxide film with the oxygen mixture ratio of 0% has many oxygen defects and has a low oxidation degree, and the titanium oxide film with the oxygen mixture ratio of 5% has few oxygen defects and has a high oxidation degree.

Further, the volume resistivity of the titanium oxide film with the oxygen mixture ratio of 0% is around $8 \times 10^2$ Ωcm, and the volume resistivity of the titanium oxide film with the oxygen mixture ratio of 5% is $1 \times 10^{13}$ Ωcm. In such a way, it is possible to significantly change the conductivity of a titanium oxide film due to an oxygen defect in accordance with the oxidation degree. Note that the oxygen mixture ratio during deposition can be above 5%, and when the oxygen mixture ratio is 10%, for example, the volume resistivity increases to $3 \times 10^{13}$ Ωcm.

As described above, in the present embodiment, it is possible to ensure a sufficient contact area between the entirely deposited intermediate layer 132 and the function layer 133 of a quantum dot film without further providing an adhesion layer made of an organic bifunctional molecule or an organic substance on the intermediate layer 132 of titanium oxide or the like. Therefore, since film removal is less likely to occur even when a ligand having no functional group causing high adhesiveness is selected for the ligand of atoms on the surface of the quantum dot film and flexibility in selection of the ligand is high, high photoelectric conversion performance can be obtained. The intermediate layer 132 having a low oxidation degree has high electrical conductivity and thus has an advantage of a reduced series-connected resistance component in the film thickness direction, however, this may reduce crosstalk in the lateral direction. In contrast, in the present embodiment, the first portions 132A of the intermediate layer 132 on the lower electrodes 131 are formed to have a low oxidation degree, and the second portions 132B between electrodes are formed to have a high oxidation degree. Thus, crosstalk due to transfer of carriers generated by the unit cell 120 in lateral direction via the intermediate layer 132 can be reduced, in addition to that reduction in film removal and high photoelectric conversion performance as described above are advantageously achieved.

Although titanium oxide is used as an example of the intermediate layer 132 in the example described above, the same advantageous effects can be obtained also when the intermediate layer 132 is another semiconductor oxide such as zinc oxide. The level of the oxidation degree can be determined by an index such as a surface analysis result by XPS, a measurement result of volume resistivity, or the like. When the surface analysis result by XPS is used, the area ratio of the peak derived from a low valence component can be determined by an index of the oxidation degree, for example. Although the oxygen mixture ratios of 0% and 5% are used as an example of the deposition condition of the first portions 132A and the second portions 132B of the intermediate layer 132, this is a mere example. As long as the condition that the oxidation degree of the second portions 132B is higher than the oxidation degree of the first portions 132A is satisfied, the advantageous effect of a reduction of crosstalk can be obtained compared to a case where the oxidation degree of the intermediate layer 132 is even.

Second Embodiment

Figure 7:
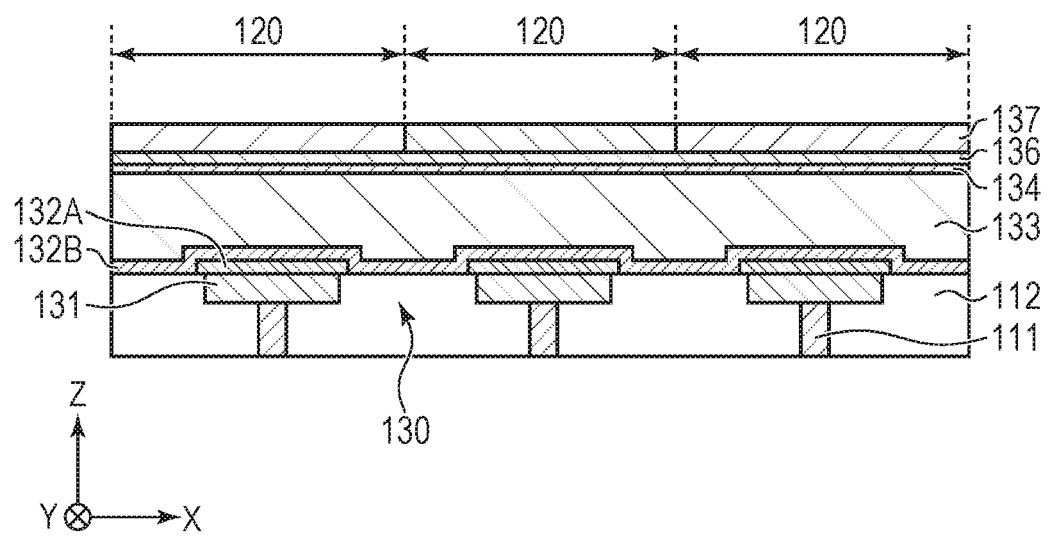
FIG. 7 is a schematic enlarged sectional view of a part around an intermediate layer of a semiconductor device according to a second embodiment.

FIG. 7 is a schematic sectional view of the semiconductor device according to a second embodiment. A difference of the present embodiment from the first embodiment is that a part of the second portion 132B of the intermediate layer 132 is arranged over the first portion 132A. In the following, different features from the first embodiment will be mainly described, and description of features common to the first embodiment may be omitted.

Each of the first portions 132A of the intermediate layer 132 is arranged in a protruded shape on the lower electrode 131. Each of the second portions 132B of the intermediate layer 132 extends from a part on the isolation region 130 to a part on the first portion 132A so as to cover the first portion 132A forming the protruded shape. In such a shape, it is not necessary that the film thicknesses of the first portion 132A and the second portion 132B are close to each other as with the first embodiment.

Thus, by forming the first portion 132A to be sufficiently thicker than the roughness of the surface of the lower electrode 131, it is possible to reduce defects in the first portion 132A due to the roughness. Further, the film thickness of the second portion 132B can be thin as far as the insulating layer 112 is not exposed. This increases the resistance between the plurality of lower electrodes 131 and prevents transfer of carriers, and crosstalk is therefore further reduced. Further, the contact area between the intermediate layer 132 and the function layer 133 is larger because the intermediate layer 132 has a protruded shape, and the adhesiveness is further improved. Note that the sum of the film thicknesses of the first portion 132A and the second portion 132B of the intermediate layer 132 may be around 1 nm to 100 nm. Further, to sufficiently obtain the advantageous effect described above, it is preferable that the film thickness of the second portion 132B of the intermediate layer 132 be smaller than the film thickness of the first portion 132A.

Third Embodiment

Figure 8:
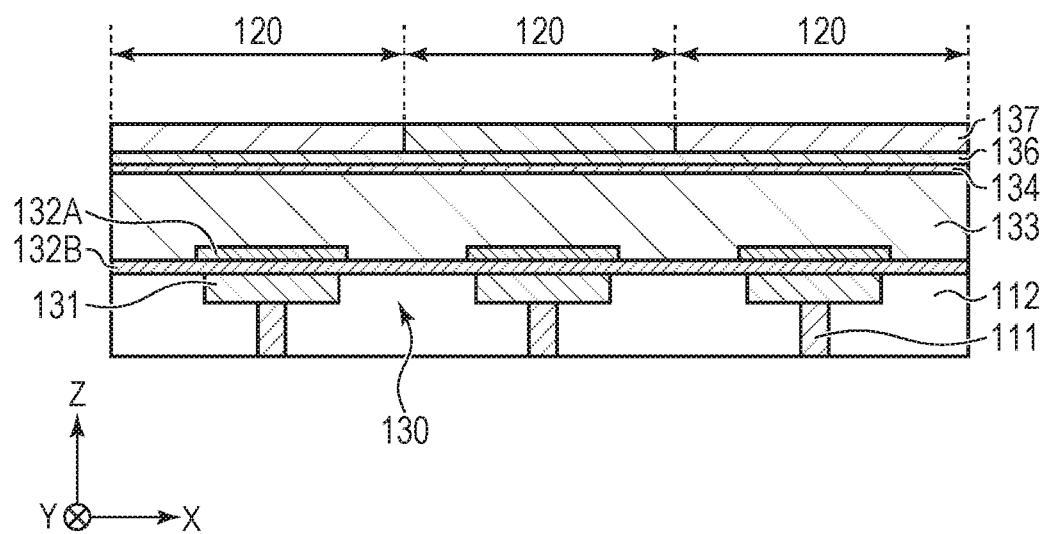
FIG. 8 is a schematic enlarged sectional view of a part around an intermediate layer of a semiconductor device according to a third embodiment.

FIG. 8 is a schematic sectional view of the semiconductor device according to a third embodiment. A difference of the present embodiment from the first embodiment is that a part of the second portion 132B of the intermediate layer 132 is arranged between the lower electrode 131 and the first portion 132A. In the following, different features from the first embodiment will be mainly described, and description of features common to the first embodiment may be omitted.

Each of the second portions 132B of the intermediate layer 132 extends from a part on the isolation region 130 to a part on the lower electrode 131. Each of the first portions 132A of the intermediate layer 132 is arranged on the second portion 132B of the intermediate layer 132 on the lower electrode 131. In such a shape, the film thicknesses of the first portion 132A and the second portion 132B are not required to be close to each other as with the first embodiment.

Also in the present embodiment, the film thickness of the second portion 132B can be thin as far as the insulating layer 112 is not exposed, in the same manner as the second embodiment. This increases the resistance between the plurality of lower electrodes 131 and prevents transfer of carriers, and crosstalk is therefore further reduced. Further, by forming the first portion 132A to be sufficiently thick, it is possible to increase the total thickness of the intermediate layer 132 on the lower electrode 131 and reduce defects in the first portion 132A due to the roughness on the surface of the lower electrode 131. Further, the contact area between the intermediate layer 132 and the function layer 133 is larger because the intermediate layer 132 has a protruded shape, and the adhesiveness is further improved. Note that the sum of the film thicknesses of the first portion 132A and the second portion 132B of the intermediate layer 132 may be around 1 nm to 100 nm. Further, to sufficiently obtain the advantageous effect described above, it is preferable that the film thickness of the second portion 132B of the intermediate layer 132 be smaller than the film thickness of the first portion 132A.

Fourth Embodiment

Figure 9:
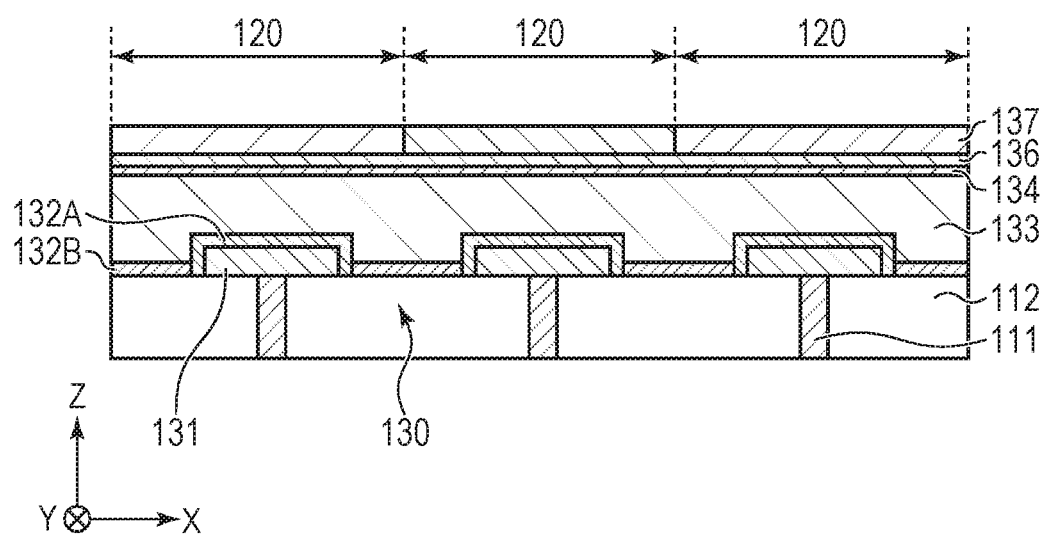
FIG. 9 is a schematic enlarged sectional view of a part around an intermediate layer of a semiconductor device according to a fourth embodiment.

FIG. 9 is a schematic sectional view of the semiconductor device according to a fourth embodiment. A difference of the present embodiment from the first embodiment is that the upper face of the lower electrode 131 is located above the upper face of the insulating layer 112. In the following, different features from the first embodiment will be mainly described, and description of features common to the first embodiment may be omitted.

Each of the lower electrodes 131 is arranged on the insulating layer 112 and the via plug 111. In the present embodiment, a process of forming the insulating layer 112 after forming the lower electrodes 131 and a planarization process to match the upper face of the lower electrodes 131 and the upper face of the insulating layer 112 to each other are omitted. Accordingly, in the present embodiment, the upper face of the lower electrode 131 is located above the upper face of the insulating layer 112. The first portion 132A of the intermediate layer 132 is formed on the upper face and the side face of the lower electrode 131. Each of the second portions 132B of the intermediate layer 132 is formed on the isolation region 130 between a plurality of lower electrodes 131. Also in the present embodiment, the contact area between the intermediate layer 132 and the function layer 133 is larger because the intermediate layer 132 has a protruded shape, and the adhesiveness is further improved, in the same manner as the second embodiment and the third embodiment.

Fifth Embodiment

Figure 10:
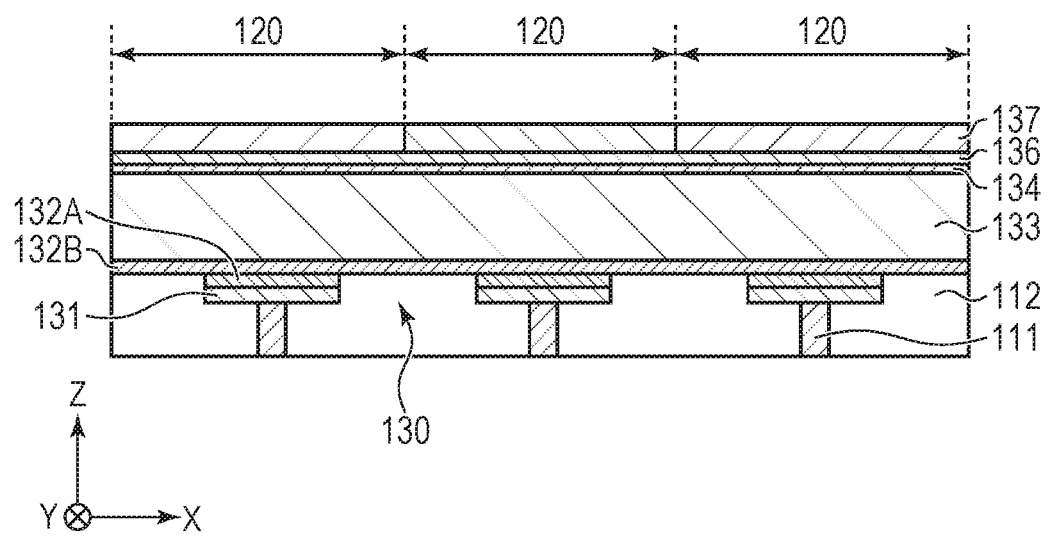
FIG. 10 is a schematic enlarged sectional view of a part around an intermediate layer of a semiconductor device according to a fifth embodiment.

FIG. 10 is a schematic sectional view of the semiconductor device according to a fifth embodiment. A difference of the present embodiment from the first embodiment is that the first portions 132A of the intermediate layer 132 is formed by surface oxidization of the lower electrodes 131. In the following, different features from the first embodiment will be mainly described, and description of features common to the first embodiment may be omitted.

Each of the first portions 132A of the intermediate layer 132 is arranged on the lower electrode 131. Each of the second portions 132B of the intermediate layer 132 extends from a part on the isolation region 130 to a part on the first portion 132A so as to cover the first portion 132A. The first portions 132A of the intermediate layer 132 are formed by surface oxidization of the lower electrodes 131. In other words, the first portion 132A of the intermediate layer 132 includes oxide of the material forming the lower electrodes 131.

For example, when the material of the lower electrodes 131 is titanium nitride (TiN), the first portions 132A of the intermediate layer 132 can be formed by oxidizing the surface of the lower electrodes 131 by an oxidization process such as plasma oxidization under an oxygen atmosphere. The material of the first portions 132A of the intermediate layer 132 in such a case is titanium oxynitride (TiON). Since an oxynitride film is a titanium oxide film having a low order oxidation number, the oxidation degree is low.

As described above, with the use of the oxidization process, the first portions 132A of the intermediate layer 132 form a conformal film compared to the case of being formed by sputtering as with the first embodiment. This can reduce defects in the first portions 132A due to roughness. Further, with the use of the oxidization process, since the first portions 132A of the intermediate layer 132 can be fabricated in a self-alignment manner on the lower electrodes 131, the step of additional patterning can be omitted. The manufacturing process is simplified.

Sixth Embodiment

The semiconductor device according to each of the first to fifth embodiments described above may be used for a photoelectric conversion element that outputs a signal in accordance with incident light by photoelectric conversion. The photoelectric conversion element may be used for a light receiving element that detects light, for example. The light receiving element has the photoelectric conversion element including the semiconductor device according to any of the first to fifth embodiments described above, a readout circuit that reads out a signal in accordance with charges generated by the photoelectric conversion element, and a signal processing circuit that processes a signal output from the readout circuit.

Further, the photoelectric conversion element described above may be used in an imaging system that generates an image in accordance with incident light. The imaging system has an optical system having a plurality of lenses and an imaging device that receives light that has passed through the optical system. The imaging device includes the photoelectric conversion element described above. Specifically, the imaging system may be a digital still camera or a digital video camera. Devices including the photoelectric conversion element such as the light receiving element, the imaging system, or the like described above may be collectively referred to as a photoelectric conversion device.

Figure 11:
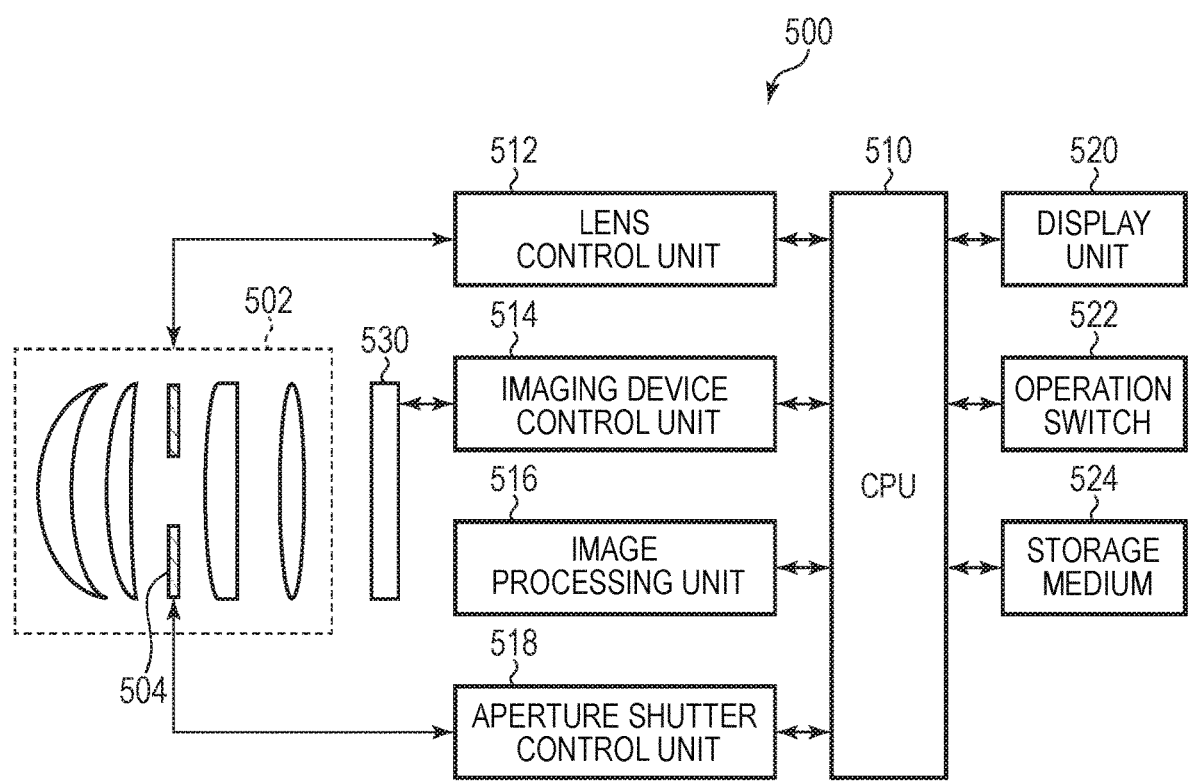
FIG. 11 is a diagram illustrating a configuration example of an imaging system according to a sixth embodiment.

The configuration example of the imaging system will be described below as a sixth embodiment of the present disclosure. FIG. 11 is a diagram illustrating a configuration example of an imaging system 500 according to the present embodiment. The imaging system 500 has an imaging device 530, an imaging optical system 502, a CPU 510, a lens control unit 512, an imaging device control unit 514, an image processing unit 516, an aperture shutter control unit 518, a display unit 520, an operation switch 522, and a storage medium 524.

The imaging optical system 502 is an optical system used for guiding incident light to the imaging device 530 to form an optical image of a subject and includes a lens group, an aperture 504, and the like. The aperture 504 has a function of adjusting the opening size thereof to adjust a light amount at capturing of an image and, in addition, has a function as a shutter for exposure time adjustment at capturing of a static image. The lens group and the aperture 504 are held so as to move forward and backward along the optical axis direction and perform the coordinated operation thereof to implement a magnification function (zoom function) and a focus adjustment function. The imaging optical system 502 may be integrated in the imaging system 500 or may be an imaging lens that can be mounted on the imaging system 500.

The imaging device 530 is arranged in an image space of the imaging optical system 502. The imaging device 530 includes a CMOS sensor (pixel unit) including the semiconductor device according to any of the first to fifth embodiments described above and the peripheral circuit thereof (peripheral circuit region). The imaging device 530 is structured such that the plurality of unit cells 120 are arranged two-dimensionally. Each of the plurality of unit cells 120 has a color filter of a predetermined color. Thereby, the imaging device 530 forms a two-dimensional one-chip color sensor. The imaging device 530 photoelectrically converts a subject image captured by the imaging optical system 502 and outputs the subject image as an image signal or a focus detection signal.

The lens control unit 512 controls driving of forward and backward motion of the lens group of the imaging optical system 502 to perform magnification operation and focus adjustment. The lens control unit 512 is formed of a circuit and a processing device configured to implement the above functions. The aperture shutter control unit 518 changes the opening size (aperture value) of the aperture 504 to adjust a light amount to be captured. The lens control unit 512 and the aperture shutter control unit 518 are formed of a circuit or a processing device configured to implement the above functions.

The CPU 510 is a control device in the camera that is responsible for various control of a camera main unit and includes a calculation unit, a ROM, a RAM, an A/D converter, a D/A converter, a communication interface circuit, or the like. The CPU 510 controls the operation of each component in the camera in accordance with a computer program stored in the ROM or the like and performs a series of image capturing operations such as AF, image capturing, image processing, storage, or the like. The AF operation that may be performed by the CPU 510 includes detection of a focusing state (focus detection) of the imaging optical system 502. The CPU 510 may have a function as a signal processing unit.

The imaging device control unit 514 controls the operation of the imaging device 530 and performs A/D conversion on a signal output from the imaging device 530 to transmit the digitally converted signal to the CPU 510. The imaging device control unit 514 is formed of a circuit or a control device configured to implement the above functions. Note that the A/D conversion function may be provided not in the imaging device control unit 514 but in the imaging device 530. The image processing unit 516 performs image processing such as γ-conversion, color interpolation, or the like on a digitally converted signal to generate an image signal.

The image processing unit 516 is formed of a circuit or a control device configured to implement the above functions. The display unit 520 is a display device such as a liquid crystal display (LCD) and displays information related to a capturing mode of the camera, a preview image before capturing, a confirmation image after capturing, a focusing state at focus detection, or the like. The operation switch 522 includes a power switch, a release (capturing trigger) switch, a zooming operation switch, a capturing mode selection switch, or the like. The storage medium 524 stores a captured image or the like. The storage medium 524 may be embedded in the imaging system 500 or may be removable medium such as a memory card.

As described above, according to the present embodiment, with application of the semiconductor device according to any of the first to fifth embodiments, the high performance imaging system 500 can be realized.

Seventh Embodiment

The semiconductor device according to each of the first to fifth embodiments described above may be used in a moving body. The moving body has a main body in which the photoelectric conversion element including the semiconductor device according to any of the first to fifth embodiments described above is provided and a motion mechanism used for causing the main body to move. A specific example of the moving body may be an automobile, an airplane, a ship, a drone, or the like. The photoelectric conversion element can capture an image of the circumference around the main body. The captured image may be used for support for operation of the moving body. The main body may be formed of a material such as a metal, carbon fibers, or the like. The carbon fiber may be, for example, polycarbonate or the like. A specific example of the motion mechanism may be a tire, a magnetic floating device, a mechanism that vaporizes and injects fuel, or the like.

Figure 12A:
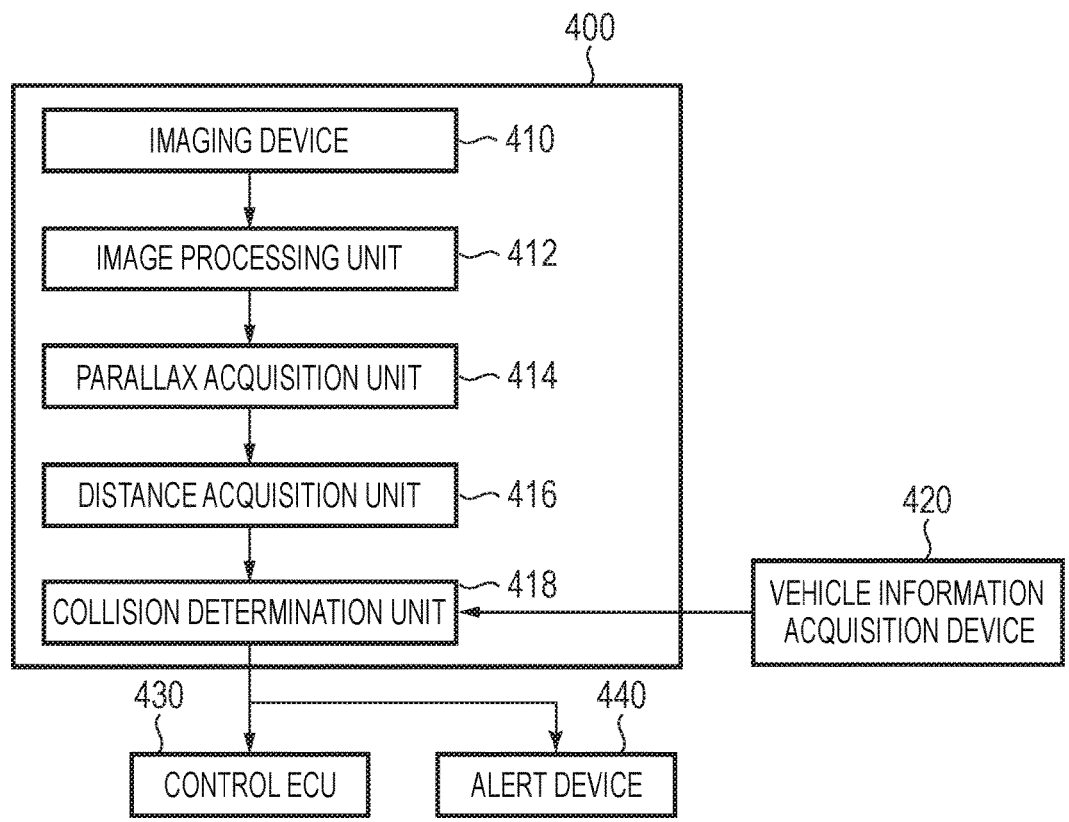
FIG. 12A and FIG. 12B are diagrams illustrating a configuration example of an imaging system and a moving body according to a seventh embodiment.
Figure 12B:
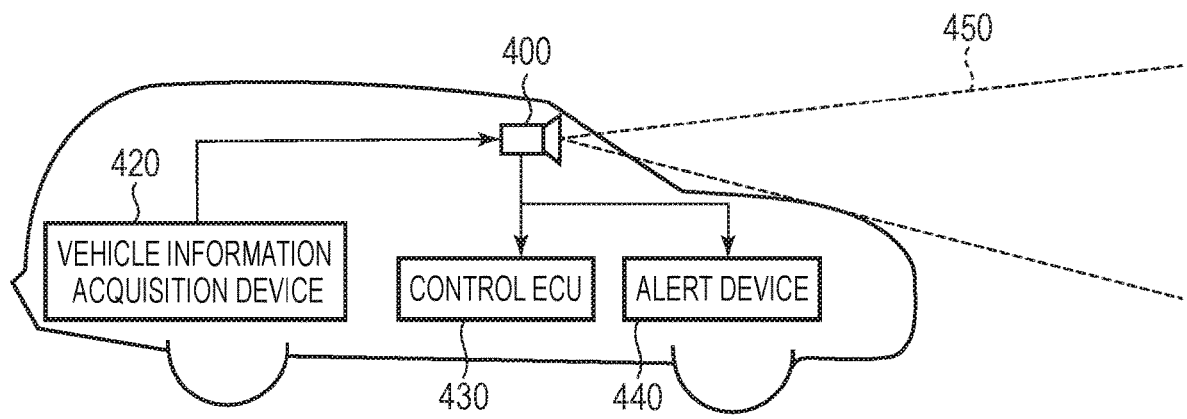

FIG. 12A and FIG. 12B are diagrams illustrating a configuration example of an imaging system and a moving body according to the present embodiment. FIG. 12A illustrates an example of an imaging system 400 related to an on-vehicle camera. An imaging system 400 has an imaging device 410, an image processing unit 412, a parallax acquisition unit 414, a distance acquisition unit 416, and collision determination unit 418. The imaging device 410 includes the semiconductor device according to any of the first to fifth embodiments described above and generates image data in accordance with incident light. The image processing unit 412 is a processing device that performs image processing on a plurality of image data acquired by the imaging device 410. The parallax acquisition unit 414 is a processing device that calculates a parallax (a phase difference of parallax images) from the plurality of image data acquired by the imaging device 410. Further, the distance acquisition unit 416 is a processing device that calculates a distance to the object based on the calculated parallax. The collision determination unit 418 is a processing device that determines whether or not there is a collision possibility based on the calculated distance. Herein, the parallax acquisition unit 414 and the distance acquisition unit 416 are an example of an information acquisition unit that acquires information such as distance information on the distance to the object. That is, the distance information is information on a parallax, a defocus amount, a distance to an object, or the like.

The collision determination unit 418 may use any of the distance information to determine the collision possibility. Various processing devices described above may be implemented by dedicatedly designed hardware or may be implemented by general purpose hardware that performs operation based on a software module. Further, the processing device may be implemented by a field programmable gate array (FPGA), an application specific integrated circuit (ASIC), or the like. Further, the processing device may be implemented by a combination of the above.

The imaging system 400 is connected to the vehicle information acquisition device 420 and can acquire vehicle information such as a vehicle speed, a yaw rate, a steering angle, or the like. Further, the imaging system 400 is connected to a control ECU 430, which is a control device that outputs a control signal for causing a vehicle to generate braking force based on a determination result by the collision determination unit 418. That is, the control ECU 430 is an example of a moving body control unit that controls the moving body based on the distance information. Further, the imaging system 400 is also connected to an alert device 440 that issues an alert to the driver based on a determination result by the collision determination unit 418. For example, when the collision determination unit 418 is outputting a determination result indicating that the collision probability is high, the control ECU 430 performs vehicle control to avoid a collision or reduce damage by applying a brake, pushing back an accelerator, suppressing engine power, or the like. The alert device 440 alerts a user by, for example, sounding an alert such as a sound, displaying alert information on a display of a car navigation system or the like, or providing vibration to a seat belt, a steering wheel, or the like.

In the present embodiment, an area around a vehicle, for example, a front area or a rear area is captured by using the imaging system 400. FIG. 12B illustrates the configuration of the imaging system 400 when a front area of a vehicle (a capturing area 450) is captured. The vehicle information acquisition device 420 transmits an instruction to the imaging system 400 to perform capturing.

As described above, according to the present embodiment, with application of the semiconductor device according to any of the first to fifth embodiments, an imaging system and a moving body with further improved ranging accuracy can be realized.

Although the example of control for avoiding a collision to another vehicle has been described above, the configuration of the present embodiment is applicable to automatic driving control for following another vehicle, automatic driving control for not going out of a traffic lane, or the like. Furthermore, the imaging system 400 is not limited to a vehicle such as the subject vehicle and can be applied to a moving body (transportation apparatus) such as a ship, an airplane, or an industrial robot, for example. The motion apparatus in the moving body (transportation apparatus) may be various motion mechanisms such as an engine, a motor, a wheel, or a propeller. Further, the imaging system 400 of the present embodiment can be widely applied to a device which utilizes object recognition, such as an intelligent transportation system (ITS), without being limited to moving bodies.

Modified Embodiments

The present disclosure is not limited to the embodiments described above, and various modifications are possible. For example, a form in which a part of the configuration of any of the embodiments is added to another embodiment or a form in which a part of the configuration of any of the embodiments is replaced with a part of the configuration of another embodiment is also one of the embodiments of the present disclosure.

Further, the imaging systems illustrated in the above embodiments are examples of an imaging system to which the semiconductor device of the present disclosure may be applied, and an imaging system to which the semiconductor device of the present disclosure can be applied is not limited to the configuration illustrated in FIG. 11, FIG. 12A, and FIG. 12B.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present disclosure, a semiconductor device with reduced crosstalk can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-163704, filed Sep. 9, 2019, which is hereby incorporated by reference herein in its entirety.

What is claimed is:

1. A semiconductor device comprising:
    a substrate;
    a plurality of first electrodes arranged away from each other with gaps on the substrate;
    a first intermediate layer arranged on each of the plurality of first electrodes;
    a second intermediate layer disposed between the first intermediate layers;
    a photoelectric conversion layer arranged on the first intermediate layer and the second intermediate layer; and
    a second electrode arranged on the photoelectric conversion layer,
    wherein the photoelectric conversion layer is in contact with the first intermediate layer and the second intermediate layer, and
    wherein a content of oxygen on a molar basis in the second intermediate layer is higher than a content of oxygen on a molar basis in the first intermediate layer.

2. The semiconductor device according to claim 1, wherein a part of the second intermediate layer is arranged on the first intermediate layer.

3. The semiconductor device according to claim 1, wherein a part of the second intermediate layer is arranged between each of the plurality of first electrodes and the first intermediate layer.

4. The semiconductor device according to claim 1, further comprising an insulating layer arranged in the gaps of the plurality of first electrodes.

5. The semiconductor device according to claim 4, wherein an upper face of each of the plurality of first electrodes is located above an upper face of the insulating layer.

6. The semiconductor device according to claim 1, wherein the first intermediate layer includes an oxide of a material forming the first electrodes.

7. The semiconductor device according to claim 1, wherein an outer edge of the first intermediate layer is located farther out than an outer edge of each of the first electrodes in a plan view.

8. The semiconductor device according to claim 1, wherein at least one of the first intermediate layer and the second intermediate layer is an N-type widegap semiconductor.

9. The semiconductor device according to claim 1, wherein at least one of the first intermediate layer and the second intermediate layer contains at least one of titanium oxide and zinc oxide.

10. A semiconductor device comprising: a first lower electrode, a second lower electrode, a second electrode, a photoelectric conversion layer arranged between the first lower electrode and the second electrode, and an insulating layer between the first lower electrode and the second lower electrode in a plan view,
    wherein the insulating layer includes a first metal and a second metal having a higher oxidation number than the first metal, and
    wherein a molar ratio of the first metal to a sum of the first metal and the second metal in a first region in contact with the first lower electrode is larger than a molar ratio of the first metal to a sum of the first metal and the second metal in a second region disposed between first regions.

11. The semiconductor device according to claim 10, wherein the first metal and the second metal are Ti.

12. The semiconductor device according to claim 1, wherein the photoelectric conversion layer includes a quantum dot.

13. The semiconductor device according to claim 12, wherein the photoelectric conversion layer includes a nanoparticle including at least one of PbS, PbSe, PbTe, InP, InAs, CdS, CdSe, and CdTe.

14. The semiconductor device according to claim 13, wherein at least one of 1,4-benzenedithiol and 1,3-benzenedithiol is on a surface of the nanoparticle.

15. The semiconductor device according to claim 13, wherein at least one of chlorine, bromine, and iodine is on a surface of the nanoparticle.

16. A photoelectric conversion device comprising:
    the semiconductor device according to claim 1; and
    an optical system that guides incident light to the semiconductor device.

17. A moving body comprising:
    a main body;
    the semiconductor device according to claim 1 provided to the main body; and
    a motion mechanism that causes the main body to move.

* * * * *